AUTOMATIC SWEEP TUNING ARRANGEMENT USING CAPACITANCE DIODES

Filed May 12, 1964

INVENTOR
KURT SCHURIG
BY Philip M. Bolton
ATTORNEY

United States Patent Office 3,384,826
Patented May 21, 1968

3,384,826

AUTOMATIC SWEEP TUNING ARRANGEMENT USING CAPACITANCE DIODES

Kurt Schurig, Altena, Germany, assignor to International Standard Electric Corporation, New York, N.Y., a corporation of Delaware Filed May 12, 1964, Ser. No. 366,814
Claims priority, application Germany, May 14, 1963, G 37,742
8 Claims. (Cl. 325—422)

ABSTRACT OF THE DISCLOSURE

An automatic station searching mechanism using capacitance diodes, in which the capacitance diodes receive the variable voltage as applied to a capacitor, which is quickly charged during the seeking operation, and in which the switch initiating the seek operation is controlled by the receiver discriminator via a relaxation stage which is designed to respond as soon as the discriminator voltage has reached a predetermined threshold level, or the seeking operation is initiated manually.

Figure 1:
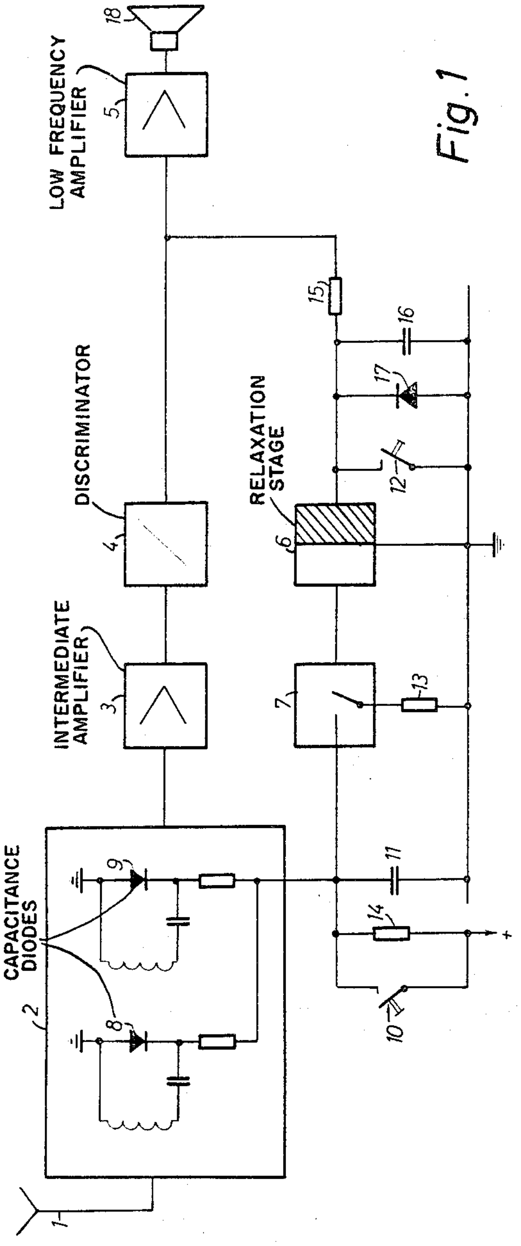

The present invention relates to an automatic station searching mechanism for broadcast and television receivers which are capable of being electronically tuned with the aid of capacitance diodes. The capacitance diodes receive the variable voltage which is applied to a capacitor, and the station searching mechanism is stopped upon reception of a signal, by the receiver discriminator, and is locked to the range of the tuning frequencies.

Besides the known electromechanical types of station searching mechanisms, there is an arrangement in which the oscillator circuits of the receiver to be tuned, are equipped with magnetic variometers. The magnetizing current of the variometers is determined by a tube whose grid is applied to a capacitor which is slowly discharged during the seeking operation. As soon as this receiver receives a signal the seeking operation is locked by the output voltage of a discriminator which thereupon determines the magnetizing current through the variometers. Irrespectively of the expenditure required for the magnetic variometers, the control output of the latter amounts to about 2 watts. Such a high additional power requirement is unreasonable for portable receivers. In order to stop the seeking operation by the discriminator upon reception of a signal, and to lock the signal in the tuning range, the output voltage of the discriminator must be by a multiple higher than the signal searching voltage, in other words, it is necessary to provide a high intermediate frequency amplification ahead of the discriminator.

On the other hand a station searching mechanism is also known, in which the tuning of the oscillator circuits of the receiver is effected with the aid of capacitance diodes, and by decoupling resistors, these diodes are applied to a capacitor which is quickly discharged during the return sweep. Although means are provided in this conventional type of arrangement for stopping the seeking operation upon reception of a signal, by the control of the receiver, it is naturally also possible to employ a discriminator which, in the conventional way, also serves the frequency fine tuning control. This discriminator, however, again must supply an output voltage which is by a multiple higher than the signal searching voltage (seeking signal). When disregarding the high intermediate frequency amplification which is necessary, it is particularly unfavorable with respect to transistorized receivers to operate the discriminator with an output voltage which is much too high for controlling the low frequency amplifier. Moreover, when effecting the tuning with the aid of capacitance diodes, it is not practical to perform the seeking operation during the charging period of the capacitor. Since the capacitor voltage rises quickly during the initial charging period, and the capacity of the tuning diodes is likewise subjected to a consederable variation, the adjusting times for the stopping of the seeking operation and for the frequency readjustment subsequently to a tuning to a signal throughout the frequency range, are very different. The control time for the seeking operation, therefore, cannot be adjusted to a optimum, because there would appear control oscillations.

The present invention avoids the aforementioned disadvantages. The invention resides in the fact that the capacitor supplying the tuning signal is quickly charged during the return sweep of the tuning, and is slowly discharged during the seeking operation; that the resistor provided for effecting the recharging of the capacitor, is so dimensioned that the capacitor voltage will slowly rise during the reception of a signal; and that the switch initiating the seeking operation, is controlled by the receiver discriminator, via a relaxation stage, which responds as soon as the discriminator voltage reaches a predetermined threshold level, or the seeking operation is initiated manually.

A station searching mechanism of this type can be operated with a low discriminator output voltage. The adjusting time throughout the entire frequency range is almost equal, and the additional energy requirement is extremely low. In the control branch there are contained no linear amplifiers. Therefore the inventive arrangement is particularly well suitable for transistorized receivers.

Figure 2:
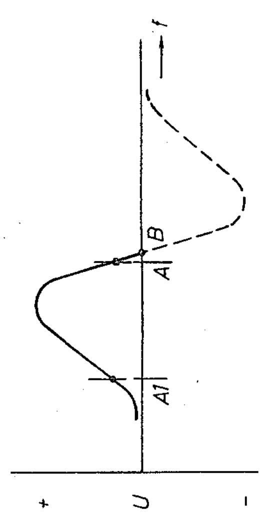

Both the construction and the mode of operation of the inventive type of station searching mechanism will now be explained in detail with reference to FIGS. 1 and 2 of the accompany drawings, in which:

FIG. 1 show the basic circuit diagram of an embodiment of a station searching mechanism according to the invention, and FIG. 2 shows the discriminator characteristic with the working points decisive for the mode of operation of the arrangement.

In FIG. 1 the signals received by the antenna 1 are applied via the preliminary stage 2, to the intermediate amplifier 3, and from there to the discriminator 4. The low-frequency component of the discriminator output voltage is fed to the speaker 18 via the low-frequency amplifier 5. The D.C. component serves to control the station searching mechanism including the relaxation stage 6 and the switch 7. The capacitance diode 8 is provided e.g. for the input circuit, and the diode 9 for the oscillator circuit of the preliminary stage 2. For effecting the return sweep, the key 10 is closed momentarily, and the capacitor 11 is quickly recharged. Thereupon the preliminary stage is tuned to the highest receiving frequency. For effecting the initiation of the seeking operation, the key 12 has to be closed. Then the relaxation stage 6 will respond to actuate the switch 7, and the capacitor 11 will discharge slowly across the resistor 13. On account of the dropping voltage of the capacitor 11, the capacitance of the diodes 8 and 9 will increase until the lowest receiving frequency is reached subsequently to the complete discharge. If the seeking operation is to be repeated, there will have to be provided an automatic control of the switches 10 and 12 (keys) which is acted upon by the charge of the capacitor 11. For tuning the receiver to a preselected station it is necessary after the terminated return sweep, to close the switch or key 12 until the intermediate frequency as formed by the desired signal, has entered the dash-lined range of the discriminator characteristic (FIG. 2). This is recognized by the fact that the program can be heard in a distorted fashion. Upon releasing the key 12 thereafter, the switch 7, by the action of the relaxation stage 6, will still remain closed till the intermediate frequency has exceeded the levels (values) B and A. As soon as the switch 7 is opened, the discharge of the capacitor 11 through resistor 13 is interrupted. Thereupon, there is initiated a recharging of the capacitor 11 as is known per se, through the resistor 14. This resistor, however, is so dimensioned in accordance with the present invention that the voltage of the capacitor 11 will slowly increase again. Consequently, the intermediate frequency increases until the stages 6 and 7 are caused to respond upon reaching the level (value) B for initiating a new discharge of the capacitor 11 through the resistor 13. Thus, the intermediate frequency oscillates slowly between the values A and B. If the linear range of the discriminator is properly dimensioned, the slow changing of the intermediate frequency will have no influence upon the quality of reproduction. The sensitivity of the relaxation stage can be easily made so high that there will only be a very small frequency difference between the values A and B.

In order to prevent the seeking operation from being affected by the low-frequency voltage and noise pulses, there is provided a low-pass filter with the resistor 15 and the capacitor 16. Quite depending on the kind and quality of the relaxation stage 6, it may still be necessary to include the diode 17 for shortening one polarity of the discriminator voltage, e.g. that of the range of the characteristic indicated by the dash-line.

If the self-tuning receiver circuit or station searching mechanism, during the reception of a signal, operates in the way described hereinbefore as an automatic frequency fine tuning control then the discharge period of the capacitor 11 which is acted upon by the discriminator, only requires a very short time, and the recharging period which is independent of the discriminator, requires a relatively long time. On account of this there will result a very effective noise suppression (interference elimination) with respect to the frequency control.

The relaxation stage 6 is to be regarded as a non-linear amplifier which may be very sensitive, because there are caused no losses of amplification due to linearization measures. Moreover, the switch 7 may be replaced by a sensitive switching transistor. Thus, the regulating time for the frequency control is determined merely by the discharge and the recharging speed of the capacitor 11. Control oscillations which otherwise often appear on account of delay time differences in the receiving and fine-tuning channel of a receiver, are thus prevented from appearing in the station searching (self-seeking) self-tuning receiver circuit according to the invention.

If the seeking operation is to be continued after the frequency of the receiver has been locked to the frequency of the received signal (station, program) then the key 12 must be actuated until the intermediate frequency has at least reached the level A1. In this case the switch 7 will then remain closed, and the seeking operation will continue until the relaxation stage 6, as already described hereinbefore, becomes responsive to reception of the next successive signal (station, program).

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. An automatic station searching mechanism for broadcast and television receivers having a discriminator comprising:

variable capacitance tuning means including a variable capacitance diode for electronically tuning said receiver;

capacitive means coupled to said tuning means for supplying a variable bias voltage to said diode;

means for rapidly charging said capacitive means;

means for slowly discharging said capacitive means for performing a station search operation;

means coupled to the discriminator of said receiver for slowly recharging said capacitive means responsive to the reception of a desired station and responsive to the output of said discriminator reaching a first predetermined threshold value; and means coupled to said discriminator for again slowly discharging said capacitive means responsive to the output of said discriminator reaching a second predetermined threshold value.

2. An automatic station searching mechanism according to claim 1 wherein said means for rapidly charging includes:

a source of D.C. voltage; and a first switch selectively coupling said source of D.C. voltage to said capacitive means.

3. An automatic station searching mechanism according to claim 2 wherein said means for slowly discharging includes a first resistor coupled to said capacitive means.

4. An automatic station searching mechanism according to claim 3 wherein said means for slowly recharging includes:

a second resistor coupling said source of D.C. voltage to said capacitive means;

second switching means coupling said first resistor to said capacitive means;

relaxation means coupling said second switching means to said discriminator for causing said first resistor to be decoupled from said capacitive means responsive to the reception of a desired station and responsive to the output of said discriminator reaching a first predetermined threshold value.

5. An automatic station searching mechanism according to claim 4 wherein said means for again slowly discharging includes said relaxation means coupling said second switching means to said discriminator for again coupling said first resistor to said capacitive means responsive to the output of said discriminator reaching a second predetermined threshold value.

6. An automatic station searching mechanism according to claim 5 wherein said first resistor is of a smaller value than said second resistor.

7. An automatic station searching mechanism according to claim 5 further comprising third switching means coupled to the input of said relaxation means for manually causing said station search mechanism to lock onto a desired station.

8. An automatic station searching mechanism according to claim 5 wherein said relaxation means is operated by the D.C. output of said discriminator.

References Cited

UNITED STATES PATENTS

| | | | |
|---|---|---|---|
| 3,153,194 | 10/1964 | Orwing et al. | 325—422 |
| 3,233,179 | 2/1966 | Klettke | 325—422 |

KATHLEEN H. CLAFFY, *Primary Examiner.*

R. S. BELL, *Assistant Examiner.*